United States Patent [19]

Schmidt

[11] 3,798,083

[45] Mar. 19, 1974

[54] FABRICATION OF SEMICONDUCTOR DEVICES

[75] Inventor: John G. Schmidt, St. Louis, Mo.

[73] Assignee: Monsanto Company, St. Louis, Mo.

[22] Filed: Dec. 8, 1972

[21] Appl. No.: 313,315

Related U.S. Application Data

[62] Division of Ser. No. 134,240, April 15, 1971, Pat. No. 3,728,784.

[52] U.S. Cl. .................................. 148/188, 148/186
[51] Int. Cl. .................................................. H01l 7/44
[58] Field of Search ............ 148/186, 188; 317/235, 317/465; 29/578

[56] References Cited

UNITED STATES PATENTS

| | | | |
|---|---|---|---|
| 3,352,725 | 11/1967 | Antell | 148/186 |
| 3,437,533 | 4/1969 | Dingwall | 148/187 |
| 3,566,517 | 3/1971 | Brown | 29/571 |
| 3,617,929 | 11/1971 | Strack | 317/234 |
| 3,689,392 | 9/1972 | Sandera | 204/192 |

*Primary Examiner*—Roy Lake
*Assistant Examiner*—W. C. Tupman
*Attorney, Agent, or Firm*—Peter S. Gilster

[57] ABSTRACT

The disclosure herein pertains to methods for fabricating planar, discrete or monolithic arrays of semiconductor devices, particularly light-emitting diodes and arrays thereof. The disclosure more particularly concerns diffusion processes to form controlled regions of P-type conductivity in N-type conductivity semiconductors.

5 Claims, 15 Drawing Figures

FABRICATION OF SEMICONDUCTOR DEVICES

This is a division of application Ser. No. 134,240, filed Apr. 15, 1971, now U.S. Pat. No. 3,728,784.

BACKGROUND OF THE INVENTION

This invention pertains to the field of semiconductor devices, particularly light-emitting devices, and fabrication methods therefor.

As pertains to a primary aspect of this invention, the prior art describes numerous methods for fabricating semiconductor devices wherein conventional photolithographic techniques are used in conjunction with various masking, impurity diffusion and etching systems to provide one or more regions of one conductivity type in semiconductor bodies of another conductivity type. By variations of these techniques simple or complex semiconductor components may be fabricated to produce a variety of electronic devices, including light-emitting devices.

Among the various diffusion systems described in the prior art are vapor phase, solid phase and liquid phase diffusions of the conductivity-type determining impurity into the masked or unmasked semiconductor substrate body to provide active regions therein. Some of the diffusions described in the prior art must be conducted in evacuated and sealed ampoules (closed tube diffusion), while others may be performed as an open-tube diffusion.

With respect to various diffusion/masking systems, it is known to use a layer of $SiO_2$ or impurity-doped $SiO_2$ through which, or through windows of which, certain impurities may be diffused into the semiconductor wafer or to use an impurity-doped Si or $SiO_2$ layer from which the impurity is diffused into the semiconductor substrate. See, e.g., U.S. Pat. Nos. 3,255,056, 3,352,725, 3,450,581, 3,502,517, 3,502,518 and 3,530,015. It is also known to use diffusion masks of silicon nitride which may be further coated with silicon (U.S. Pat. No. 3,537,921) or metals (U.S. Pat. No. 3,519,504) which are deposited in direct contact with a surface of the semiconductor body. Another masking/diffusion system involves masks having separate, distinct portions consisting, respectively, of various oxides, e.g., $SiO_2$, and laminated $Si_3N_4/SiO_2$ or $SiO_2/Si_3N_4/SiO_2$; this latter type of combination mask has been described (U.S. Pat. No. 3,484,313) in connection with a selective diffusion process for diffusing a plurality of different types of impurities into different regions of a semiconductor body, each portion of the mask being effective to block or partially block specified impurities.

Problems commonly encountered in most prior art diffusion systems include poor control and reproducibility of the impurity surface concentration, diffusion profile, junction depth and planarity of the P-N junction. Still other problems relate to masking systems used; for example, lack of adhesion of the mask to the semiconductor surface; permeability of the mask to the in-diffusing impurity and/or out-diffusion of volatile constituents or desired impurities in intermetallic or elemental semiconductors, thus requiring very thick or heavily-doped masking layers; reactivity of the masking material with the impurity and/or semiconductor body and necessity to use a closed-tube diffusion with some masking systems.

Therefore, it is an object of the present invention to provide a unique diffusant-masking system for fabricating semiconductor devices.

More particularly, it is an object of this invention to provide a solid-solid, open-tube diffusion process which overcomes the above-mentioned problems.

Still more particularly, it is an object of the present invention to provide a diffusion system which is controllable, simple and economical.

These and other objects will become apparent from the detailed description given below.

SUMMARY OF THE INVENTION

This invention relates to a unique impurity diffusant-masking system to fabricate semiconductor devices; in preferred embodiments, planar, discrete or monolithic arrays of light-emitting diodes (LED's) are provided.

The semiconductor device fabrication process herein comprises the use of an impurity diffusion system consisting of an $SiO_2/ZnO/$densified $SiO_2$ sandwich-structure diffusant source in conjunction with an $SiO_2/Si_3N_4/SiO_2$ sandwich-structure diffusion mask; both the diffusant source and diffusion mask being in intimate contact with the semiconductor body of N-type conductivity, to provide a means of diffusing zinc into selected areas (of any configuration) thereof. Upon heating the structure, zinc is diffused from the diffusant source to form a region of P-type conductivity in the N-type semiconductor substrate body.

An additional feature of this invention involves the formation of metal contact $P^+$ regions within the P region resulting from the above diffusion. The $P^+$ region may be formed in any known manner, e.g., by closed-tube diffusion using elemental zinc, zinc arsenide or a zinc/gallium alloy, or by open-tube diffusion using the above $SiO_2/ZnO/$densified $SiO_2$ diffusant or a zinc-doped silica diffusion layer. Thereafter, ohmic contact is made to the $P^+$ surface in the P region of the semiconductor by metallization through windows in a photoresist mask, and ohmic contact is made to the N surface, preferably by means of alloying successive layers of tin and gold with the semiconductor material, followed by deposition of successive layers of nickel and gold. A lead wire is bonded to the P contact and the device attached by the N contact to a base or header, then encapsulated.

DESCRIPTION OF PREFERRED EMBODIMENTS

The present invention is its preferred embodiments relates to a method for fabricating planar light-emitting semiconductor devices, either as discrete LED's or as an array of LED's on a monolithic semiconductor substrate. Preferred semiconductor materials include gallium arsenide, gallium phosphide and gallium arsenide phosphide.

EXAMPLE

In a preferred embodiment of the invention, LED's are prepared with gallium arsenide (GaAs) as the semiconductor component of the device.

Figure 1:
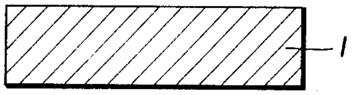
FIGS. 1–12 are cross-sectional schematic views of a semiconductor wafer during successive steps, prior to applying the P contact metallization pattern in the fabrication of an LED.
Figure 2:
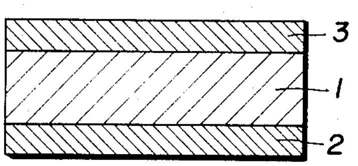
Figure 3:
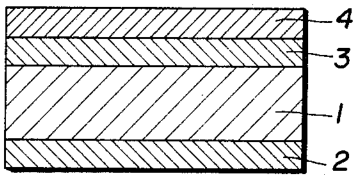
Figure 4:
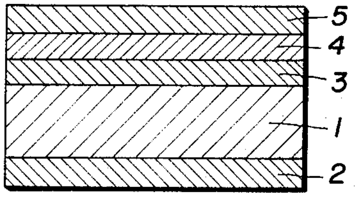

Referring to the drawings, which show successive stages in the fabrication process, FIG. 1 represents a cleaned and polished GaAs wafer 1 in cross-section schematic view. The GaAs is of N-type conductivity doped with silicon to a carrier concentration suitably within the range of about 1–5×$10^{18}$ atoms/cc. In FIG. 2, a layer 2 of $SiO_2$ about 1,500 A thick is deposited on the back (bottom) surface and a layer 3 of $SiO_2$ about 200 A thick is deposited on the front (top) surface of the GaAs substrate wafer 1; these $SiO_2$ layers may be prepared and deposited by various means known to the art and in this example, by reacting silane ($SiH_4$) with oxygen carried by nitrogen at temperatures of from 300°–400°C to deposit $SiO_2$ on the GaAs wafer. A layer 4 of silicon nitride, $Si_3N_4$, is then formed, e.g., by reacting silane with ammonia in forming gas (95% $N_2$ - 5% $H_2$) at 800°–900°C to deposit the $Si_3N_4$ layer 4 atop $SiO_2$ layer 3 as shown in FIG. 3. At the temperatures required for the formation and deposition of $Si_3N_4$, the volatile component of the semiconductor, arsenic in this example, tends to out-diffuse from the GaAs; hence, $SiO_2$ layer 2 is used to prevent such out-diffusion. The $Si_3N_4$ layer in this example is about 350 A thick, but suitably may be thicker. A layer 5 of $SiO_2$ from 1,500 A to 2,000 A thick is then deposited, in the manner described above, atop the $Si_3N_4$ layer 4 as shown in FIG. 4. $SiO_2$ layer 5 serves as a mask to define the pattern to be etched in the $Si_3N_4$ layer.

Figure 5:
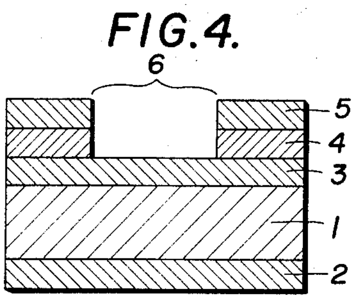
Figure 6:
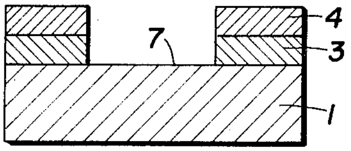

Using conventional photolithographic techniques, a window 6, shown in FIG. 5, is then etched through the $SiO_2$ layer 5 with a mixture of $NH_4F{\cdot}HF{\cdot}H_2O$. The photoresist layer (not shown) is then removed from $SiO_2$ layer 5 and a window within the same region defined by the symbol 6, is etched through the $Si_3N_4$ layer 4 with hot (170°C) concentrated phosphoric acid, which has negligible effect on the $SiO_2$, as shown in FIG. 5. Again using the mixed $NH_4F{\cdot}HF{\cdot}H_2O$ etchant, a window is etched within region 6 (FIG. 5) through $SiO_2$ layer 3 to expose a surface (diffusion) region 7 of the GaAs substrate 1 and simultaneously etch away the remaining portion of $SiO_2$ layer 5; $SiO_2$ layer 2 is also removed by the etching operation, leaving the structure shown in FIG. 6.

Figure 7:
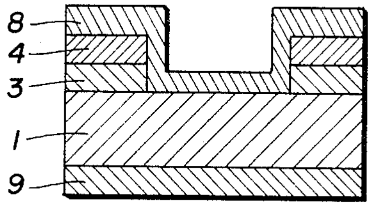

After opening the window through $SiO_2$ and $Si_3N_4$ layers as described, the wafer is then rinsed with deionized water (DI), dried, cleaned with $NH_4OH$ rinsed again with DI, then with isopropyl alcohol (IPA) and again dried. A fresh layer 9 of $SiO_2$ is then deposited over the back surface of the GaAs wafer (to prevent out-diffusion of arsenic during subsequent treatment) and a fresh layer 8 of $SiO_2$ is also deposited on the front surface of the wave covering the $Si_3N_4$ layer 4 and surface region 7 of the wafer as shown in FIG. 7; these $SiO_2$ layers 8 and 9 are both about 1,200 A thick. The wafer is now heat treated at about 875°C or, generally, within the range of from 800°–950°C, in forming gas for about 1 hour. This is a highly important step, involving annealing of the $SiO_2$/GaAs interface as well as forming a densified modulating layer 8 for the subsequent diffusion of zinc therethrough, thus providing further control of the zinc diffusion into the GaAs wafer. This step in the process is not necessary when the substrate material is GaP.

Figure 8:
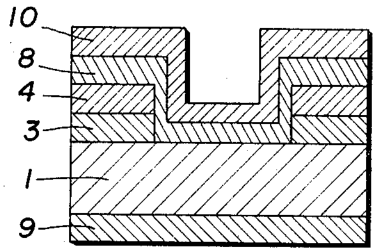
Figure 9:
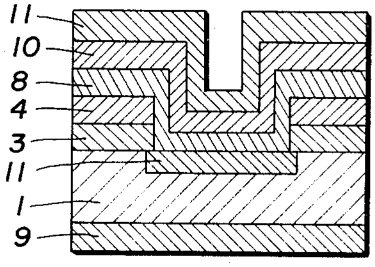

Following the heat treatment, a layer 10 of zinc oxide (ZnO) about 300 A thick is deposited on layer 8 as shown in FIG. 8. The ZnO layer is formed and deposited by reacting diethyl zinc, carried in nitrogen, with oxygen at about 400°C or, generally, within the range of from 300°–500°C. A final layer 11 of $SiO_2$ about 500 A thick is then deposited over the ZnO layer as shown in FIG. 9. The $SiO_2$ layer tends to retard out-diffusion of zinc from the ZnO layer. The wafer thus prepared is then transferred to an open tube diffusion furnace and heated to 875°C in forming gas for 7 hours. Zinc is diffused from the ZnO layer through the modulating $SiO_2$ layer 8 into the substrate wafer to form a graded P region 11 (FIG. 9) approximately 6 microns below the surface which has a surface zinc concentration of about 3×$10^{19}$ atoms/cc.

It will be apparent that the diffusion times and temperatures may be varied with a variation of the thicknesses of the ZnO and modulating $SiO_2$ layers, zinc concentration and junction depth of the P region and semiconductor substrate material. For example, when the semiconductor material to be diffused is GaP or GaAsP, the diffusion time is 30 minutes at the same temperature used for GaAs diffusions.

Figure 10:
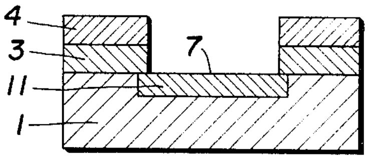
Figure 11:
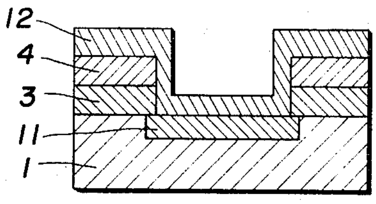

After the diffusion operation the cooled wafer is then treated in aqueous HF or a 1:8 parts by volume aqueous mixture HF:$NH_4F$ for a time, less than a minute, sufficient to etch away the $SiO_2$ layer 9 and the $SiO_2$/ZnO/$SiO_2$ diffusant layers (8, 10 and 11) shown in FIG. 9 and leave the $Si_3N_4$/$SiO_2$ masked structure shown in FIG. 10. This structure is then cleaned with sequential treatments with hot HCl, DI, isopropyl alcohol (IPA), dried, soaked in $NH_4OH$ for a few minutes, and again treated with DI, IPA, then dried. The cleaned wafer is then transferred to an $SiO_2$ reactor where a fresh layer 12 of $SiO_2$ about 3,000 A thick is deposited on the top surface of the wafer as shown in FIG. 11. Using this basic structure any desired metallization pattern may be formed on the device by use of conventional photolithographic techniques.

Figure 12:
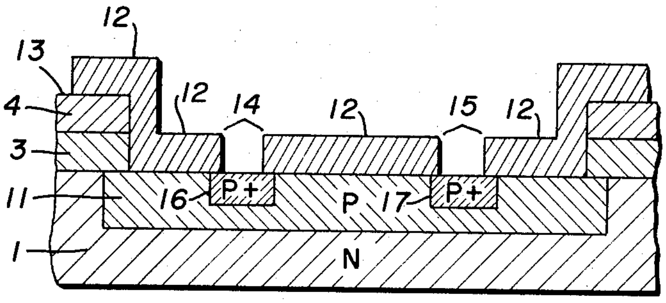
Figure 14:
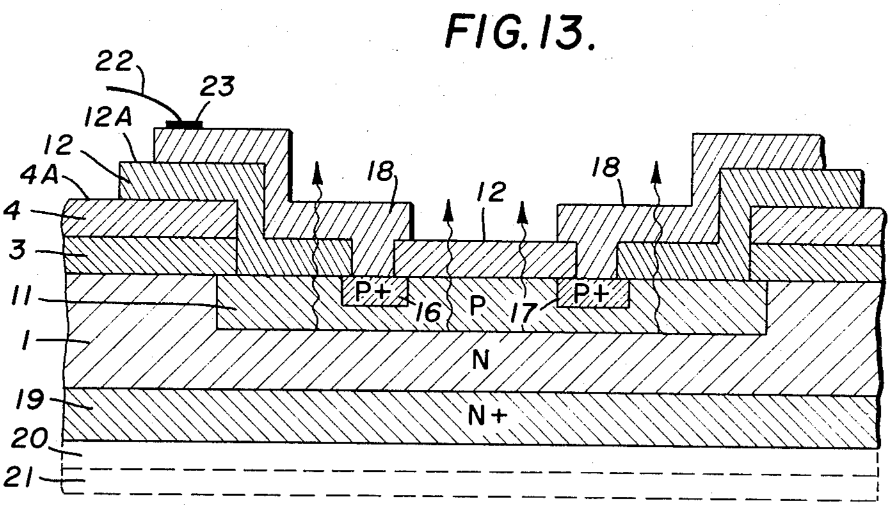
FIG. 14 is a cross-sectional schematic view taken along line A–A' of the LED shown in FIG. 15.
Figure 15:
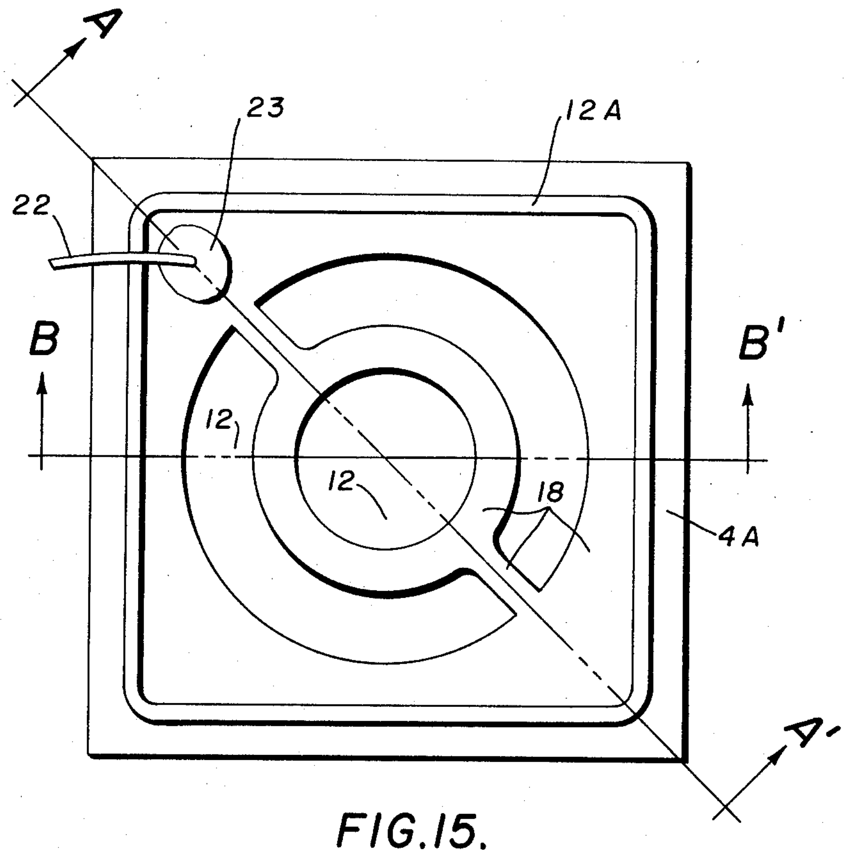
FIG. 15 is a top plan view of one embodiment of an LED fabricated according to this invention.

As illustrative LED devices fabricated according to this invention, the following description will refer to fabrication of the device shown in top plan view in FIG. 15. Referring to FIG. 12, (which, together with FIGS. 13 and 14, has been enlarged for clarity), windows (holes or apertures) 14 and 15 are opened through $SiO_2$ layer 12 by photomasking and etching to expose surface areas of the GaAs substrate to which metal contacts are to be made. Prior to metallization, it has been found that superior contact may be made to GaAs wafers by forming $P^+$ regions in the P layer defined by the area under windows 14 and 15. This is accomplished by "flash diffusing" additional zinc into the P layer exposed by the windows by any suitable means. For example, by use of the above $SiO_2$/ZnO/$SiO_2$ diffusant, or a zinc-dried silica film may be spun onto the wafer and heated in an open tube diffusion furnace at 875° for 5–8 minutes in forming gas. Another method utilizes a closed-tube vapor diffusion of zinc from various sources, e.g., from zinc arsenide, the diffusion being conducted at 800° for 5–8 minutes. The flash diffusion operation and $P^+$ regions have not as yet been found particularly helpful in making superior metal contact to GaP or GaAsP as with GaAs.

Figure 13:
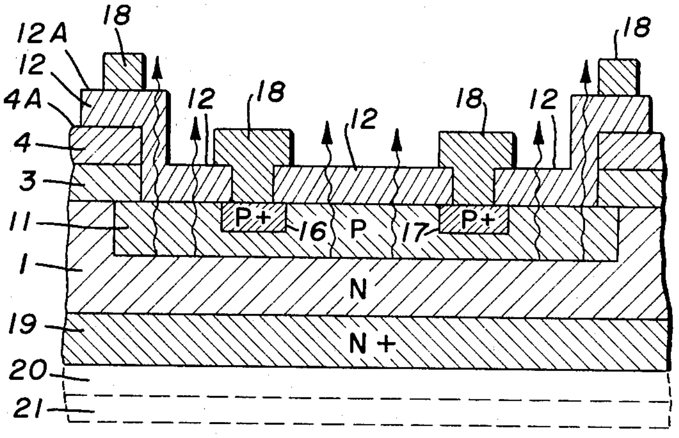
FIG. 13 is a cross-sectional schematic view taken along horizontal line B–B' of a completely fabricated LED (shown in plan view in FIG. 15).

After the $P^+$ regions are formed, aluminum is then vacuum evaporated to a thickness of 1,000–1,500 A over the surface of the wafer making contact with the $P^+$ regions of the GaAs wafer. Using photomasking and etching, the aluminum metallization pattern 18 is defined on the LED device as shown in FIG. 15; FIG. 13 is a cross-sectional view of the device taken along the horizontal line B–B′ and FIG. 14 is a cross-sectional view taken along diagonal line A–A′ in FIG. 15.

After the wafer has been cleaned, ohmic contact is made to the back (N surface) by any suitable means. A preferred ohmic contact method is disclosed and claimed in copending application, U.S. Ser. No. 21,637, filed Mar. 23, 1970 and assigned to the assignee of this application. That method involves vacuum evaporating first a layer of tin, then a layer of gold onto the N-surface, heating the wafer to alloy the tin and gold with a surface region of GaAs to form an $N^+$ region 19 therein as shown in FIGS. 13 and 14; a layer of nickel 20 is then electroless plated onto the $N^+$ region followed by electroless plating a layer of gold 21 to the nickel. Alternatively, the tin, gold, nickel and gold layers may be first deposited then all four alloyed together with a surface region of GaAs to form the $N^+$ region 19 therein. Thereafter, the device is attached, N side down, to a post or header (not shown), a wire lead 22 bonded to the aluminum in the area 23, e.g., as shown in FIGS. 14 and 15 and, finally, encapsulated in a suitable lens (not shown) for LED's, e.g., clear epoxy.

The preferred embodiment of the invention described herein is by way of illustration only, and not limitation. Other semiconductor materials in the III–V family of intermetallic compounds and mixtures or alloys thereof may be diffused according to the process of this invention as hereinabove described with reference to GaAs, GaP and $GaAs_{1-X}P_X$ where X represents a numerical value from zero to one inclusive. The use of impurity oxides other than ZnO, e.g., CdO, in the same structural and functional relationship to the diffusion mask and semiconductor is within the purview of this invention, as well as other impurity blocking substitutes for the $Si_3N_4$ layer exemplified. These and other modifications of the invention will occur to those skilled in the art without departing from the spirit and scope thereof.

I claim:

1. Process for diffusing impurities into a semiconductor body which comprises:

a. providing a semiconductor substrate;

b. applying to the front surface of said substrate a laminated impurity diffusion masking system consisting of a layer of $Si_3N_4$ sandwiched between layers of $SiO_2$;

c. etching diffusion windows through said diffusion masking system to expose diffusion surfaces of said substrate;

d. depositing a layer of $SiO_2$ over the back surface of said substrate and another layer of $SiO_2$ over the front surface of said substrate;

e. heat treating the structure of step (d);

f. depositing a layer of impurity oxide onto said layer of $SiO_2$ deposited on the front surface of said substrate in step (d);

g. depositing a layer of $SiO_2$ onto said layer of impurity oxide and h. heating the structure of step (g) to diffuse impurities from said impurity oxide into said semiconductor.

2. Process according to claim 1 wherein said impurity oxide is ZnO.

3. Process according to claim 2 wherein said semiconductor substrate is of N-type conductivity and is selected from the group consisting of III–V compounds and mixtures thereof.

4. Process according to claim 3 wherein said semiconductor substrate is $GaAs_{1-X}P_X$, where X is a number from zero to one inclusive.

5. Process according to claim 4 wherein X equals zero and said semiconductor substrate is GaAs.

* * * * *